United States Patent
Sagawa et al.

(10) Patent No.: US 7,944,141 B2
(45) Date of Patent: May 17, 2011

(54) ORGANIC ELECTRIC FIELD LIGHT-EMITTING DISPLAY DEVICE

(75) Inventors: Hiroshi Sagawa, Kanagawa (JP); Katsuhide Uchino, Kanagawa (JP)

(73) Assignee: Sony Corporation, Tokyo (JP)

( * ) Notice: Subject to any disclaimer, the term of this patent is extended or adjusted under 35 U.S.C. 154(b) by 186 days.

(21) Appl. No.: 12/257,965

(22) Filed: Oct. 24, 2008

(65) Prior Publication Data

US 2009/0128017 A1  May 21, 2009

(30) Foreign Application Priority Data

Nov. 15, 2007  (JP) ................. 2007-296572

(51) Int. Cl.
*H01J 1/62* (2006.01)
(52) U.S. Cl. .............. 313/506; 313/500; 315/169.1; 315/169.3
(58) Field of Classification Search .......... 313/498–512; 315/169.1, 169.3
See application file for complete search history.

(56) References Cited

U.S. PATENT DOCUMENTS

| 2002/0158835 | A1 | 10/2002 | Kobayashi et al. | |
| 2003/0063081 | A1* | 4/2003 | Kimura et al. | 345/211 |
| 2003/0201708 | A1 | 10/2003 | Yamada et al. | |
| 2004/0041753 | A1* | 3/2004 | Nakanishi | 345/76 |
| 2004/0160170 | A1 | 8/2004 | Sato et al. | |
| 2005/0184654 | A1* | 8/2005 | Kobayashi | 313/504 |
| 2005/0275771 | A1* | 12/2005 | Matsueda | 349/110 |

FOREIGN PATENT DOCUMENTS

| JP | 2001-195008 | 7/2001 |
| JP | 2002-318553 | 10/2002 |
| JP | 2004-207217 | 7/2004 |

\* cited by examiner

*Primary Examiner* — Bumsuk Won
(74) *Attorney, Agent, or Firm* — Robert J. Depke; Rockey, Depke & Lyons, LLC

(57) ABSTRACT

An organic electric field light-emitting display device includes: a plurality of pixel circuits, each disposed at one of the intersections between a plurality of signal lines and a plurality of scan lines, each of the pixel circuits including an organic electric field light-emitting element; a power auxiliary circumferential line electrically connected to one of two electrodes adapted to apply an electric field to the organic electric field light-emitting element, the power auxiliary circumferential line being disposed in a ring-like arrangement around the pixel arrangement region; and a plurality of dummy wirings formed on the underlying layer of the power auxiliary circumferential line between the intersections between either one of the plurality of signal lines and the plurality of scan lines and the power auxiliary circumferential line, the plurality of dummy wirings being insulated and isolated from the signal or scan line in proximity.

5 Claims, 8 Drawing Sheets

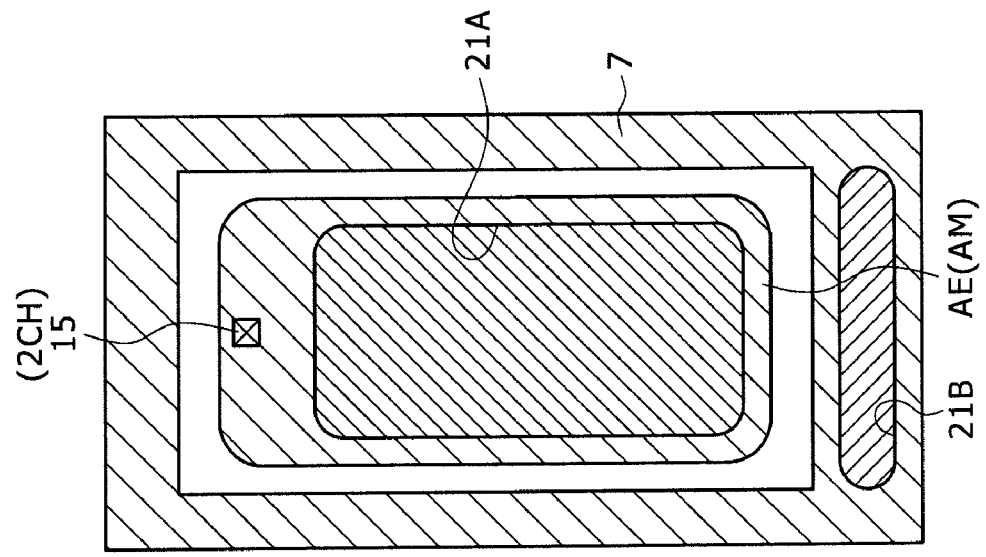
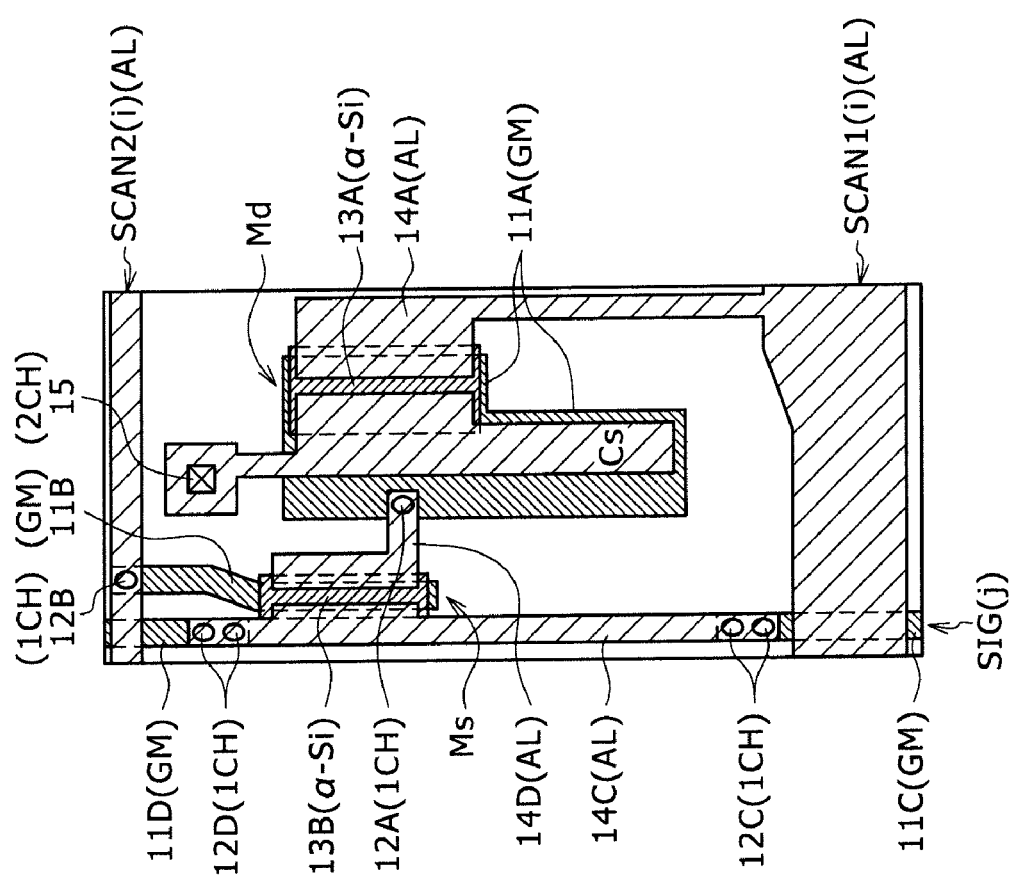

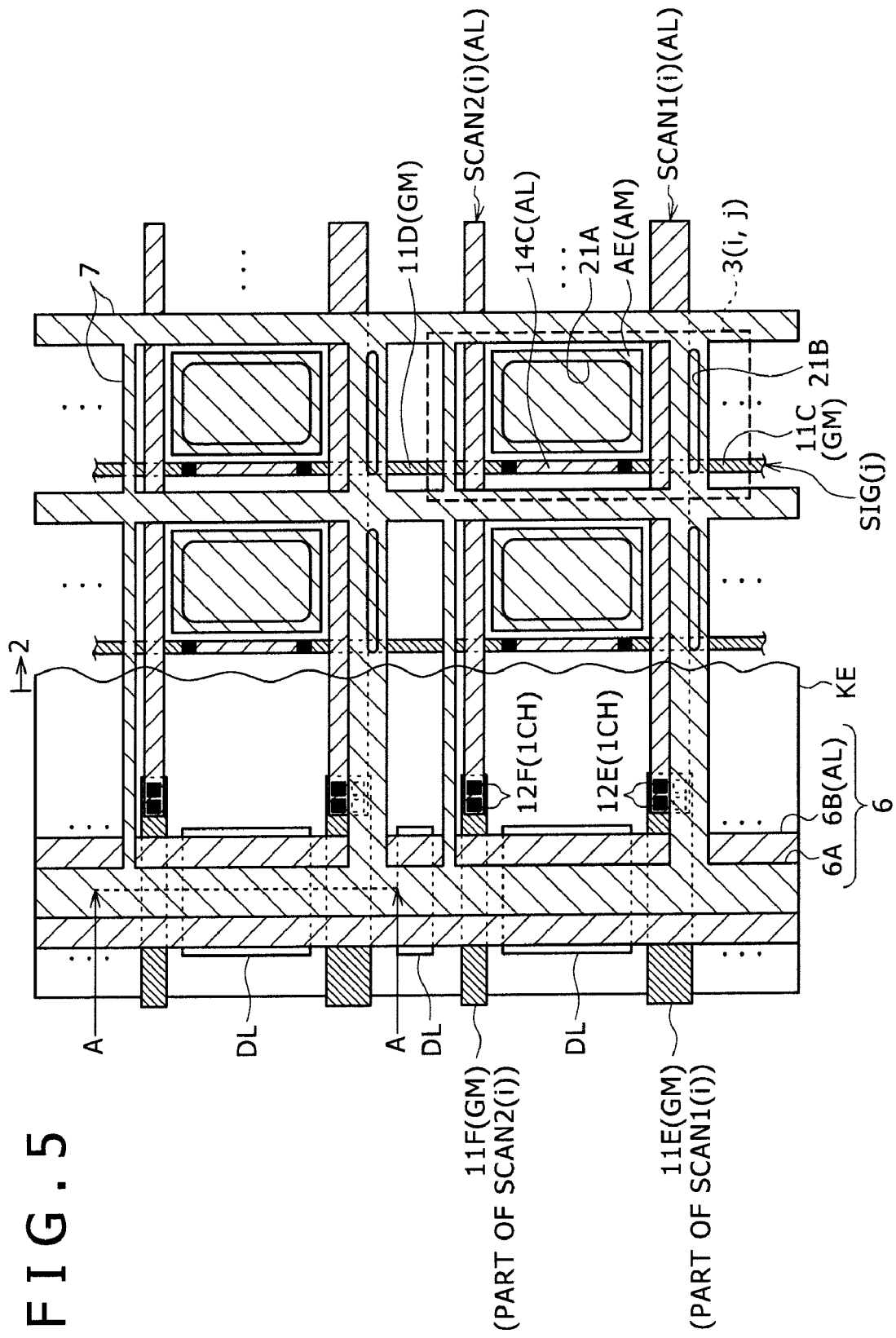

ORGANIC ELECTRIC FIELD LIGHT-EMITTING DISPLAY DEVICE

CROSS REFERENCES TO RELATED APPLICATIONS

The present invention contains subject matter related to Japanese Patent Application JP 2007-296572 filed in the Japan Patent Office on Nov. 15, 2007, the entire contents of which being incorporated herein by reference.

BACKGROUND OF THE INVENTION

1. Field of the Invention

The present invention relates to an organic electric field light-emitting (EL) display device having, for each pixel, an organic electric field light-emitting (EL) element adapted to emit light when a current flows through its organic multilayer film between two electrodes as a result of application of an electric field between the two electrodes.

2. Description of the Related Art

An organic EL display device (organic EL display) has a display panel which includes a display section and drive section of the display section. The display section has a plurality of pixel circuits arranged in a matrix. The display panel is manufactured by forming the display and drive sections on a single substrate using the semiconductor technology which includes the TFT (thin film transistor) forming process. Alternatively, the drive circuits of the display panel are supplied by a flexible substrate, and the substrate and display panel are electrically connected together.

Various types of circuits are proposed for use as a pixel circuit of the organic EL display to prevent image quality degradation caused by the variation in characteristics of the TFTs in the pixel circuits.

Major and well known among the proposed types of circuits are the 4T/1C pixel circuit with four transistors (4T) and one capacitor (1C) as well as 4T/2C, 5T/1C and 3T/1C pixel circuits.

All of the above pixel circuits incorporate a correction circuit adapted to control the current flow through the organic EL element at a constant level. As a result, the potential of one of the electrodes of the organic EL element is controlled according to the variation in characteristics. In contrast, at the other electrodes, a common potential such as ground voltage is applied commonly to a plurality of pixels of a pixel section.

Therefore, the potential of one of the electrodes is corrected to a certain extent. However, the potential of the other electrode (e.g., ground voltage) remains uncorrected. As a result, image quality degradation such as shading or crosstalk manifests itself in the event of a variation in potential of the other electrode in the pixel section.

Here, if shading or crosstalk occurs, a voltage drop in a power line, adapted to supply positive power to the organic EL element, is typically often regarded as a problem. However, such image quality degradation also occurs due to the variation in negative power such as the ground voltage.

Shading is a phenomenon in which the pixel (more specifically, organic EL element) brightness changes gradually between the pixels closer to and farther from the power source in the display rows (horizontal arrangement of the pixels) of the pixel section. If the common potential such as ground voltage is non-uniform to such an extent that it rises gradually with increasing distance from the power source, shading manifests itself on the display image in a more intense manner.

On the other hand, in the case in which shading does not occur, even if two adjacent pixels of interest in the adjacent rows far from the power source attempt to emit the same brightness, crosstalk may manifest itself. Crosstalk is a phenomenon in which if the drive current consumption from the power source to the pixel of interest is different between the adjacent pixel rows to which the two pixels of interest belong, the pixel of interest in the pixel row which consumes more drive current appears darker than that in the pixel row which consumes less drive current. If the common potential such as ground voltage is non-uniform to such an extent that it rises gradually with increasing distance from the power source, crosstalk manifests itself on the display image in a more intense manner.

In order to prevent uneven display such as shading and crosstalk, the provision of an auxiliary wiring is proposed which is lower in resistance than the common electrode of the organic EL element, i.e., the upper electrode (refer, for example, to Japanese Patent Laid-Open Nos. 2001-195008, 2002-318553 and 2004-207217 (hereinafter referred to as Patent Documents 1, 2 and 3)).

In Patent Documents 1 to 3, an auxiliary wiring is disclosed which is formed in the vicinity of the pixel border. This wiring is disposed in a grid-like arrangement and surrounds a pixel opening portion. A wiring disposed in such a grid-like arrangement will be hereinafter particularly referred to as a power auxiliary grid line.

In Patent Document 2, on the other hand, another auxiliary wiring disposed in a ring-like arrangement (referred to as a second electrode power line in Patent Document 2) is provided which is electrically connected to the power auxiliary grid line and surrounds the pixel arrangement region. This auxiliary wiring in a ring-like arrangement will be hereinafter referred to as a power auxiliary circumferential line.

SUMMARY OF THE INVENTION

The power auxiliary circumferential line is disposed around the pixel section. As a result, the same line crosses over a signal or scan line (typically the display row select line running in the horizontal direction). The signal line is connected from the pixel section to the drive section to supply a video signal which determines the display gray level. Typically, the power auxiliary circumferential line crosses over the signal or scan line at a right angle via an insulating film.

Here, at a root portion of the signal or scan line close to a so-called signal source (drive section) in the connection from the pixel section to the drive section, a plurality of wiring layers are often laminated one on top of the other to reduce the wiring resistance of the signal or scan line. Therefore, the power auxiliary circumferential line needs to typically overcome a comparatively large height difference when crossing over the root portion of the signal or scan line in the connection from the pixel section to the drive section. This may lead to a high resistance in part of the power auxiliary circumferential line or a disconnection of the same line due to the height difference.

On the other hand, an EL protection film is formed on the overlying layer of the power auxiliary circumferential line, for example, by low-temperature CVD which is conducted at a temperature of 100 degrees or less. However, there is an undeniable concern that air holes may be formed in the EL protection film due to a height difference and that contamination may spread from these air holes due, for example, to moisture or foreign matter to such an extent that even the pixel section is adversely affected.

It is desirable to prevent disconnection of the power auxiliary circumferential line due to a height difference at intersections between the power auxiliary circumferential line and signal or scan lines. It is also desirable to prevent air holes which could cause contamination.

An organic electric field light-emitting display device according to an embodiment (first embodiment) of the present invention includes a plurality of signal lines, a plurality of scan lines, a plurality of pixel circuits, a power auxiliary circumferential line and a plurality of dummy wirings.

The plurality of pixel circuits are each disposed at one of the intersections between the plurality of signal lines and the plurality of scan lines. Each of the pixel circuits includes an organic electric field light-emitting (organic EL) element and is provided for each pixel.

The power auxiliary circumferential line is electrically connected to one of the two electrodes of the organic EL element between which an electric field is applied. The same line is disposed in a ring-like arrangement around the pixel arrangement region.

The plurality of dummy wirings are formed on the underlying layer of the power auxiliary circumferential line between a plurality of intersections between at least either one of the plurality of signal lines or the plurality of scan lines and the power auxiliary circumferential line. The plurality of dummy wirings are insulated and isolated from the signal or scan line in proximity.

An organic electric field light-emitting display device according to another embodiment (second embodiment) of the present invention has the following feature in addition to the features of the first embodiment. That is, each of the plurality of dummy wirings is electrically connected to the power auxiliary circumferential line on the overlying layer at least at two locations in the direction in which the same line is disposed. As a result, dummy wirings serve as backing wirings of the power auxiliary circumferential line.

An organic electric field light-emitting display device according to still another embodiment (third embodiment) of the present invention has the following feature in addition to the features of the first embodiment. That is, each of the plurality of pixel circuits includes a given number of thin film transistors (TFTs) formed on a thin film semiconductor layer and gate electrode layer which are the underlying layers of the organic EL element. The plurality of signal or scan lines at the intersections and the plurality of dummy wirings include at least two conductive layers laminated during the formation of each of the thin film semiconductor layer and gate electrode layer.

An organic electric field light-emitting display device according to still another embodiment (fourth embodiment) of the present invention has the following feature in addition to the features of the first embodiment. That is, the organic EL element is formed by laminating the lower layer electrode, organic multilayer film and upper layer electrode one on top of the other. A power auxiliary grid line is provided which is formed by a wiring layer at the same layer level as the lower layer electrode. The power auxiliary grid line surrounds each of the pixel circuits and is electrically connected to the upper layer electrode. The power auxiliary grid line and power auxiliary circumferential line are formed by the wiring layer at the same layer level. The plurality of signal or scan lines have each of their ends connected to a bridge line on the underlying layer for extension. The bridge lines are at the same layer level as the dummy wirings. The power auxiliary circumferential line crosses over each of the plurality of bridge lines via an insulating film.

In the fourth embodiment, each of the plurality of pixel circuits should preferably include a given number of thin film transistors (TFTs) formed on a thin film semiconductor layer and gate electrode layer which are the underlying layers of the organic EL element. The plurality of bridge lines and the plurality of dummy wirings should preferably include at least two conductive layers laminated during the formation of the thin film semiconductor layer and gate electrode layer.

According to the first embodiment, the plurality of dummy wirings are formed on the underlying layer of the power auxiliary circumferential line. The plurality of dummy wirings are formed between intersections between the power auxiliary circumferential line and at least either one of the plurality of signal lines or the plurality of scan lines. The plurality of dummy wirings are insulated and isolated from the signal or scan lines. This alleviates, by means of the dummy wirings, any height difference on the surface where the power auxiliary circumferential line is formed during the formation thereof, thus providing a more planarized surface. As a result, the power auxiliary circumferential line is resistant to disconnection due to a height difference. In addition, air holes can also be prevented.

According to the second embodiment, each of the dummy wirings made of a wiring material is connected to the power auxiliary circumferential line on the overlying layer at least at two locations. This allows for formation of a bypass route for transmission of the potential in portions of the power auxiliary circumferential line, thus providing a reduced resistance in these portions. Further, if the resistance becomes higher in these portions of the power auxiliary circumferential line or if the same line disconnects in these portions, the dummy wiring serves as an alternative wiring of the power auxiliary circumferential line, thus ensuring redundancy.

According to the third embodiment, the plurality of signal lines, the plurality of scan lines and the plurality of dummy wirings at the intersections include at least two conductive layers laminated during the formation of each of the thin film semiconductor layer and gate electrode layer. The thin film semiconductor layer and gate electrode layer make up the TFTs. As a result, the signal or scan lines and dummy wirings can be formed at the same layer level and at the same height, further alleviating the height difference (providing a more flat surface).

According to the fourth embodiment, the lower layer electrode of the organic EL element, the power auxiliary circumferential line and the power auxiliary grid line (major portion thereof) are formed by the wiring layer at the same layer level. The plurality of signal lines and a plurality of control lines have their ends formed, on an underlying layer, as bridge lines at the same layer level as the dummy wirings for extension. The power auxiliary circumferential line crosses over the bridge lines via the insulating film. Therefore, a wiring layer is used for the power auxiliary circumferential line and power auxiliary grid line. Other than this wiring layer, the (conductive) layer structure of the organic electric field light-emitting display device includes an upper layer electrode layer of the organic EL elements and several other conductive layers such as TFT gate electrode layer and thin film semiconductor layer. Thus, the organic electric field light-emitting display device has a simple conductive layer structure.

The present invention can effectively prevent disconnection of the power auxiliary circumferential line due to a height difference at an intersection between the power auxiliary circumferential line and signal or scan line. The present invention can also effectively prevent air holes which could cause contamination. This makes it possible to provide a highly reliable organic electric field light-emitting display device with a low defect rate which prevents uneven display and offers high reliability.

BRIEF DESCRIPTION OF THE DRAWINGS

FIG. 3B is a plan view of a pixel according to the embodiments of the present invention, and FIG. 3A is a plan view of the pixel without electrodes of an organic EL element;

FIG. 5 is a plan view illustrating a connection portion between a pixel array and power auxiliary circumferential line together with part of the pixel array;

DETAILED DESCRIPTION OF THE PREFERRED EMBODIMENTS

The preferred embodiments of the present invention will be described below with reference to the accompanying drawings, taking as an example, an organic EL display having both the power auxiliary circumferential line and power auxiliary grid line.

First Embodiment

<Overall Configuration>

Figure 1:
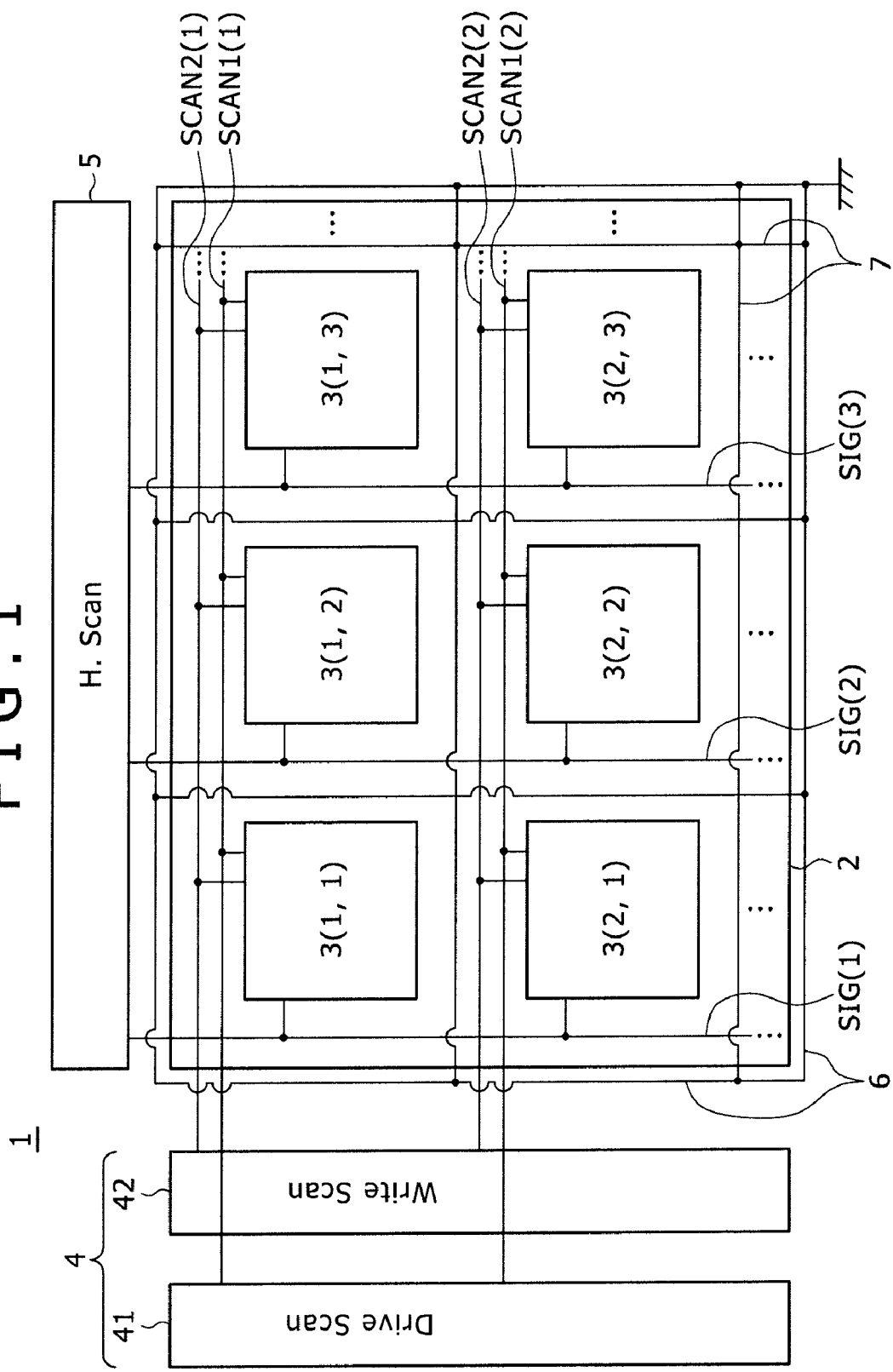
FIG. 1 is a block diagram illustrating an example of major components of an organic EL display according to first and second embodiments of the present invention.

FIG. 1 illustrates major components of an organic EL display according to embodiments of the present invention.

An organic EL display 1 illustrated includes a pixel array 2 and drive circuits adapted to drive the pixel array 2. The pixel array 2 has a plurality of pixel circuits 3($i, j$) arranged in a matrix. The size of the pixel array 2 defines the "pixel arrangement region."

The drive circuits include vertical drive circuits (V. scanners) 4 and horizontal drive circuit (H. scanner: H. Scan) 5.

The plurality of V. scanners 4 are provided according to the configuration of the pixel circuits 3. Here, the V. scanners 4 are a horizontal pixel line drive circuit (Drive Scan) 41 and write signal scan circuit (Write Scan) 42.

Reference numerals 3($i, j$) of the pixel circuits shown in FIG. 1 mean that each of the circuits has a vertical address i (i=1 or 2) and horizontal address j (j=1, 2 or 3). These addresses 'i' and 'j' take on an integer value of 1 or larger, with their maximum values being 'n' and 'm' respectively. Here, only part of the pixel array 2, namely, the pixels having 1 or 2 as i and 1, 2 or 3 as j, is shown for simplification of the drawing.

This address notation is applied to the elements, signals, signal lines and voltage in the pixel circuits in the description and drawings given hereinafter.

Pixel circuits 3(1, 1) and 3(2, 1) are connected to a common first signal line SIG(1) running in the vertical direction. Similarly, pixel circuits 3(1, 2) and 3(2, 2) are connected to a common second signal line SIG(2) running in the vertical direction. Pixel circuits 3(1, 3) and 3(2, 3) are connected to a common third signal line SIG(3) running in the vertical direction.

A first scan signal (drive signal for the first display row) can be applied to the pixel circuits 3(1, 1), 3(1, 2) and 3(1, 3) in the first row by means of a common first scan line SCAN1(1) from the horizontal pixel line drive circuit 41. Similarly, a first scan signal (drive signal for the second display row) can be applied to the pixel circuits 3(2, 1), 3(2, 2) and 3(2, 3) in the second row by means of a common first scan line SCAN1(2) from the horizontal pixel line drive circuit 41.

Further, a second scan signal (sampling signal for the first display row) can be applied to the pixel circuits 3(1, 1), 3(1, 2) and 3(1, 3) in the first row by means of other common second scan line SCAN2(1) from the write signal scan circuit 42. Similarly, a second scan signal (sampling signal for the second display row) can be applied to the pixel circuits 3(2, 1), 3(2, 2) and 3(2, 3) in the second row by means of other common second scan line SCAN2(2) from the write signal scan circuit 42.

A power auxiliary circumferential line 6 in a ring-like arrangement is disposed around the pixel array 2.

Further, a power auxiliary grid line 7 in a grid-like arrangement is disposed around each of the pixel circuits 3($i, j$) within the pixel array 2.

A common potential such as ground voltage can be applied to the power auxiliary circumferential line 6. On the other hand, each end of the power auxiliary grid line 7 extending outward from the pixel array 2 is connected to the power auxiliary circumferential line 6. Therefore, the power auxiliary circumferential line 6 and power auxiliary grid line 7 are ideally maintained at a common potential (e.g., ground voltage).

<Pixel Circuit>

Figure 2:
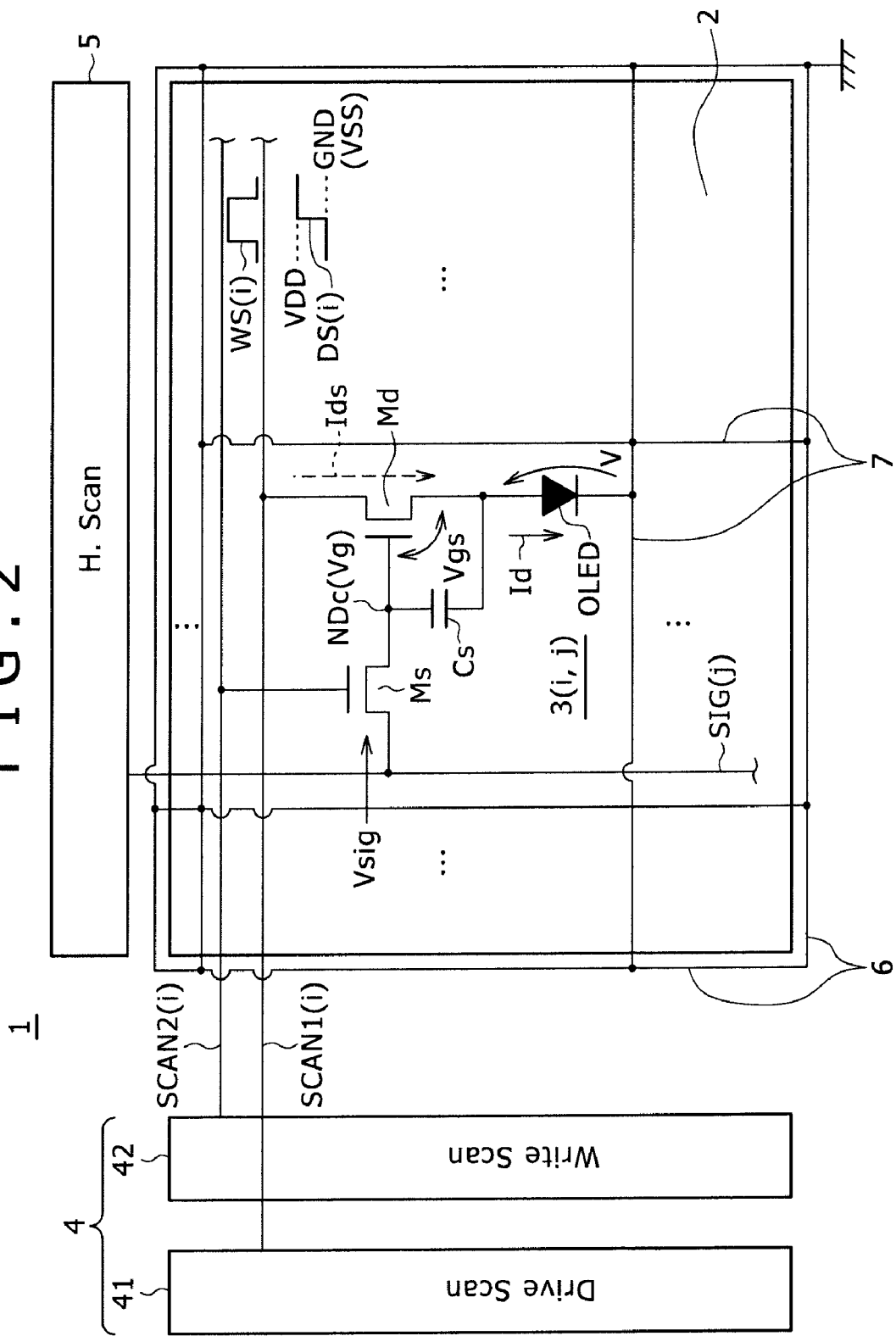
FIG. 2 is a diagram illustrating a configuration example of a pixel circuit according to the embodiments of the present invention.

A configuration example of the pixel circuit 3($i, j$) is illustrated in FIG. 2.

The pixel circuit 3($i, j$) illustrated controls an organic light-emitting diode OLED serving as a light-emitting element. The pixel circuit includes a drive transistor Md, sampling transistor Ms and holding capacitor Cs, in addition to the organic light-emitting diode OLED. The drive transistor Md and sampling transistor Ms each include an NMOS TFT.

The organic light-emitting diode OLED has a layered structure made up, for example, of a "lower layer electrode", layered body and "upper layer electrode." First, an anode electrode serving as the "lower layer electrode" is formed on a substrate made, for example, of glass. Next, the layered body which makes up an organic multilayer film is formed on the anode electrode by sequentially laminating a hole transporting layer, a light-emitting layer, an electron transporting layer and an electron injection layer and other layers. Finally, a cathode electrode serving as the "upper layer electrode" is formed on the layered body. The anode electrode is connected to a positive power source, and the cathode electrode to a negative power source.

It should be noted that FIG. 2 illustrates a case in which the anode of the organic light-emitting diode OLED is supplied with a source voltage VDD from a positive power source and that the cathode thereof is connected to a reference voltage VSS such as ground voltage GND. However, if the organic light-emitting diode OLED needs to be reverse-biased, the reference voltage VSS is controlled at a voltage level lower than the ground voltage GND.

If a bias voltage adapted to provide a given electric field is applied between the anode and cathode electrodes of the organic light-emitting diode OLED, the same diode OLED emits light when the injected electrons and holes recombine in the light-emitting layer. The organic light-emitting diode OLED can emit any of red (R), green (G) and blue (B) lights if the organic substance making up the organic multilayer film is selected as appropriate. Therefore, the display of color image can be achieved by arranging the pixels in each row so that each pixel can emit R, G and B lights. Alternatively, the distinction between R, G and B may be made by filter colors by using a white light-emitting organic substance. Still alternatively, four colors, namely, R, G, B and W (white), may be used instead.

The drive transistor Md functions as current control means adapted to control the amount of current flowing through the light-emitting element (organic light-emitting diode OLED) so as to determine the display gray level.

The drive transistor Md has its drain connected to the scan line adapted to control the supply of a source voltage VDD. The same transistor Md has its source connected to the anode of the organic light-emitting diode OLED.

The sampling transistor Ms is connected between a supply line (signal line SIG(j)) of a data potential Vsig and the gate of the drive transistor Md. The signal line SIG(j) determines the pixel gray level. The same transistor Ms has one of its source and drain connected to the gate of the drive transistor Md and the other thereof connected to the signal line SIG(j). A data pulse having the data potential Vsig is applied to the signal line SIG(j) from the H. scanner 5 (refer to FIG. 1). The sampling transistor Ms samples the data having the level to be displayed by the pixel circuit in a timely manner during this data potential application period (data pulse duration time). This is to eliminate the influence of unstable level during the transition period on the display image. The level is unstable in the front and rear edges of the data pulse which has the desired data potential Vsig to be sampled.

The holding capacitor Cs is connected between the gate and source (anode of the organic light-emitting diode OLED) of the drive transistor Md. The roles of the holding capacitor Cs will be clarified in the description of the operation which will be given later.

In FIG. 2, a power drive pulse DS(i) is supplied to the drain of the drive transistor Md by the horizontal pixel line drive circuit 41 shown in FIG. 1. The power drive pulse DS(i) rises from the GND potential to the source voltage VDD. Power is supplied during the correction of the drive transistor Md or light emission of the organic light-emitting diode OLED.

Further, a write drive pulse WS(i) having a relatively short duration time is supplied to the gate of the sampling transistor Ms from the write signal scan circuit 42 shown in FIG. 1, thus allowing for the sampling to be controlled.

It should be noted that the supply of power may be alternatively controlled by inserting another transistor between the drain of the drive transistor Md and the supply line of the source voltage VDD and controlling the gate of the inserted transistor by means of the horizontal pixel line drive circuit 41.

All transistors in the pixel circuit are normally formed by TFTs. The thin film semiconductor layer used to form the TFT channels is made of a semiconductor material including polysilicon or amorphous silicon. Polysilicon TFTs can have a high mobility but varies significantly in their characteristics, which makes these TFTs unfit for use in a large-screen display device. Therefore, amorphous silicon TFTs are typically used in a display device having a large screen. It should be noted, however, that P-channel TFTs are difficult to form with amorphous silicon TFTs. As a result, N-channel TFTs should preferably be used for all the TFTs as in the pixel circuit 3(i, j).

Here, the pixel circuit 3(i, j) is an example of a pixel circuit applicable to the present invention, namely, an example of basic configuration of a 2T/1C pixel circuit with two transistors (2T) and one capacitor (1C). Therefore, the pixel circuit which can be used in the present embodiment may have additional transistor and/or capacitor in addition to the basic configuration of the pixel circuit 3(i, j). In some pixel circuits having the basic configuration, the holding capacitor Cs is connected between the supply line of the source voltage VDD and the gate of the drive transistor Md.

More specifically, 4T/1C, 4T/2C, 5T/1C and 3T/1C pixel circuits may be used, for example, in addition to the 2T/1C pixel circuit applicable to the present embodiment, although the detailed configuration thereof will not be shown.

<Outline of the Light Emission Control Operation>

The light emission control operation of the pixel circuit 3(i, j) can be outlined as follows.

That is, the holding capacitor Cs is coupled to a control node NDc of the drive transistor Md. The signal voltage from the signal line SIG(j) is sampled by the sampling transistor Ms. The obtained data potential Vsig (post-sampling data potential will be hereinafter particularly written as Vin) is applied to the control node NDc.

When the given data potential Vin is applied to the gate of the drive transistor Md, a drain current Ids of the same transistor Md is determined by a gate-to-source voltage Vgs which has a level appropriate to the data potential Vin. As a result, the organic light-emitting diode OLED emits light at the brightness appropriate to the post-sampling data potential Vin.

As is well known, the I-V characteristic of the organic light-emitting diode OLED changes due to heat. At this time, the gate-to-source voltage Vgs of the drive transistor Md also changes with change of the organic light-emitting diode OLED over time.

This changes a drive current Id flowing through the organic light-emitting diode OLED, thus changing the light emission brightness even when the given data potential Vsig is sampled.

Further, the drive transistor Md has a different threshold voltage Vth and mobility μ from one pixel circuit to another. This leads to a variation in the drain current Ids, causing the different pixels to emit light at different brightness levels even when the pixels are supplied with the same data potential Vsig.

The pixel circuit having an N-channel transistor drive transistor is advantageous in that the circuit has high driving capability and that the manufacturing process can be simplified. In order to suppress the variation in the threshold voltage Vth and mobility μ, however, the correction operation described below is required prior to the aforementioned light emission control operation.

Prior to the sampling, the gate potential of the drive transistor Md is maintained at the level of the threshold voltage Vth by the holding capacitor Cs. This preliminary operation is referred to as "threshold correction."

After the threshold correction, the post-sampling data potential Vin is added to the gate of the drive transistor Md. As a result, the gate potential is maintained at "Vth+Vin." The drive transistor Md turns on in response to the magnitude of the data potential Vin at this time. If the same transistor Md has the large threshold voltage Vth which makes it difficult for the transistor to turn on, the magnitude of "Vth+Vin" is also large. In contrast, if the same transistor Md has the small threshold voltage Vth which makes it easy for the transistor to turn on, the magnitude of "Vth+Vin" is small. This eliminates the influence of the variation in the threshold voltage Vth from the drive current. As a result, if the data potential Vin is constant, so is the drain current Ids (drive current Id).

Further, the mobility correction (driving force correction) is conducted, for example, prior to the data sampling and following the threshold correction.

In the mobility correction, the gate potential is further varied from "Vth+Vin" depending on the current driving capability of the drive transistor Md. A path is provided between the gate and source of the drive transistor Md to charge or discharge the holding capacitor with the current flowing via the current channel of the drive transistor Md. The mobility correction is conducted by controlling whether to allow a current to flow through this path.

Thereafter, the organic light-emitting diode OLED emits light as it is driven by this constant current value.

<Examples of Plan and Sectional Structures>

Here, the plan pattern and sectional structure of the pixel circuit will be described below with reference to the drawings.

Figure 4A:
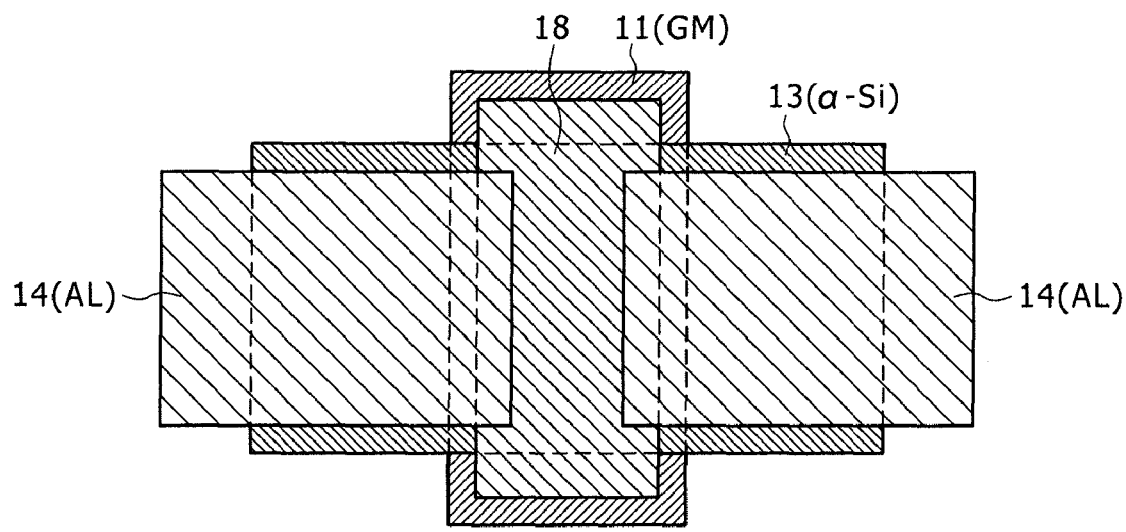
FIG. 4A is a plan view of a basic TFT structure applicable to the embodiments of the present invention.
Figure 4B:
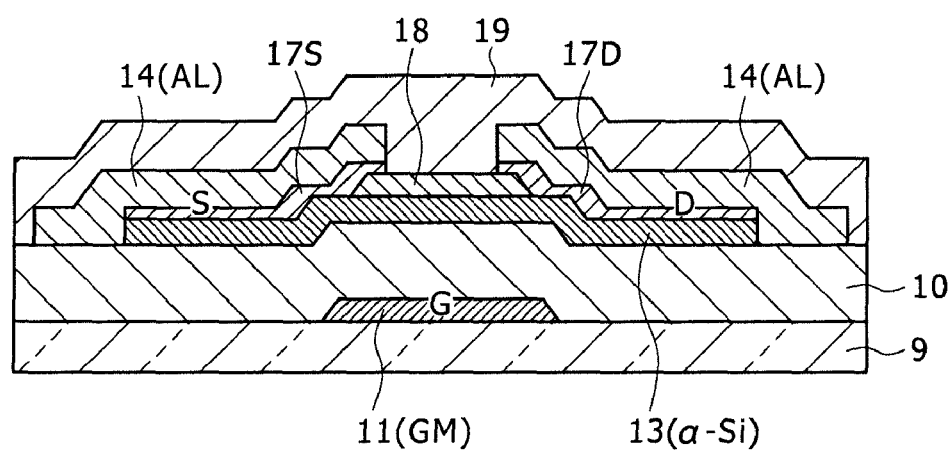
FIG. 4B is a sectional view thereof.

FIGS. 3A and 3B illustrate the plan pattern of the pixel circuit 3(i, j). FIG. 3B is a plan view of the pixel circuit without the cathode electrode on the topmost layer (cathode electrode formed over the entire surface). FIG. 3A is a plan view of the pixel circuit during its manufacture without the cathode electrode on the topmost layer and further without the electrodes and organic multilayer film of the organic light-emitting diode OLED. FIG. 4B is a basic sectional structural view of a TFT section, and FIG. 4A is a plan view thereof.

As illustrated in FIG. 4B, a gate electrode 11 is formed directly on a substrate 9 as shown in the figure (or indirectly via an underlying layer (type of insulating layer)). The substrate 9 is made, for example, of glass. The gate electrode 11 includes, for example, a gate metal layer (GM) which is made of a high-melting metal layer such as molybdenum (Mo).

The gate electrode 11 corresponds to a gate electrode 11A of the drive transistor Md and a gate electrode 11B of the sampling transistor Ms in FIG. 3A. Here, the gate electrode 11A is spread into the forming region of the holding capacitor Cs so that the same electrode 11A functions also as the lower layer electrode of the holding capacitor Cs. On the other hand, one end of the gate electrode 11B is extended under the second scan line SCAN2(i) for connection between the gate electrode 11B and second scan line SCAN2(i).

A gate insulating film 10 is formed on the substrate 9 in such a manner as to cover the surface of the gate electrode 11 shown in FIG. 4B. A thin film semiconductor layer 13 made of amorphous silicon (α-Si) is formed on top of the gate insulating film 10.

The thin film semiconductor layer 13 corresponds to a TFT layer 13A of the drive transistor Md and a TFT layer 13B of the sampling transistor Ms in FIG. 3A.

The portion of the thin film semiconductor layer 13 shown in FIG. 4B opposed to the gate electrode 11 is the channel forming region. A channel protection film 18 made of an insulating material is formed where the channel forming region on the thin film semiconductor layer 13 is to be protected. Further, two source/drain electrodes 14 are disposed in such a manner that one of their ends rides over the channel protection film 18. The source/drain electrodes 14 are slightly narrower than the thin film semiconductor layer 13 (refer to FIG. 4A). The source/drain electrodes 14 are spaced from each other on the channel protection film 18. One of the source/drain electrodes 14 functions as the source (S) electrode, and the other as the drain (D) electrode. The two source/drain electrodes 14 are formed, for example, by a wiring layer whose main component is aluminum (AL).

The source/drain electrodes 14 in FIGS. 4A and 4B correspond to a VDD line 14A and connection wiring 14B in FIG. 3A. The VDD line 14A branches off from the first scan line SCAN1(i) and functions as the drain electrode of the drive transistor Md. The connection wiring 14B functions as the source electrode of the drive transistor Md. The connection wiring 14B is disposed over the large-area portion of the gate electrode 11A so that the same wiring 14B functions as the upper layer electrode of the holding capacitor Cs. Further, the connection wiring 14B has a pad portion for connection with the anode electrode of the organic light-emitting diode OLED.

Still further, the source/drain electrodes 14 in FIGS. 4A and 4B correspond to connection wirings 14C and 14D in FIG. 3A. The connection wiring 14C functions as the drain electrode of the sampling transistor Ms. The connection wiring 14D functions as the source electrode of the sampling transistor Ms. The connection wiring 14C also functions as part of the signal line SIG(j). The connection wiring 14D has its end extended above the lower electrode (gate electrode 11A) of the holding capacitor Cs for connection with the control node NDc shown in FIG. 2. As a result, the end of the connection wiring 14D is connected to the gate electrode 11A by a contact 12A which is one of the first contact holes.

As illustrated in FIG. 4B, source and drain impurity regions 17S and 17D are provided where the two source/drain electrodes 14 and thin film semiconductor layer 13 overlap each other. The source and drain impurity regions 17S and 17D are doped with an N-type impurity of high concentration which is reverse in conductivity type to the P-type thin film semiconductor layer 13. By the source impurity region 17S, a source contact, which provides a low-resistance connection between one of the source/drain electrodes 14 and the thin film semiconductor layer 13, is achieved. Similarly, by the drain impurity region 17D, a drain contact, which provides a low-resistance connection between the other source/drain electrode 14 and thin film semiconductor layer 13, is achieved.

In FIG. 3A, the first and second scan lines SCAN1(i) and SCAN2(i) are both formed by (AL) layers. The two scan lines are disposed parallel to each other along the opposed sides in the row direction within the cell.

In contrast, the signal line SIG(j) is formed long in the column direction intersecting the first and second scan lines SCAN1(i) and SCAN2(i).

Much of the portion of the signal line SIG(j) within the cell includes the connection wiring 14C made of the (AL) layer as described earlier.

A bridge line 11C is provided at the intersection between the signal line SIG(j) and first scan line SCAN1(i). The bridge line 11C is disposed at the same layer level and includes the same material layer (GM) as the gate electrode 11. One end of the connection wiring 14C is connected to the bridge line 11C on the underlying layer by means of two contacts (1CH) 12C. The first scan line SCAN1(i), disposed at the same layer level and made of the same material (AL) as the connection wiring 14C, intersects the same wiring 14C above the bridge line 11C.

Similarly, a bridge line 11D is provided at the intersection between the signal line SIG(j) and second scan line SCAN2(i). The bridge line 11D is disposed at the same layer level and includes the same material layer (GM) as the gate electrode 11. The other end of the connection wiring 14C is connected to the bridge line 11D on the underlying layer by means of two contacts (1CH) 12D. The second scan line SCAN2(i), disposed at the same layer level and made of the same material (AL) as the connection wiring 14C, intersects the same wiring 14C above the bridge line 11D.

Referring back to FIG. 4B, a TFT protection film 19 is deposited to cover the TFT having the aforementioned structure.

Although not shown in FIG. 4B, the organic light-emitting diode OLED and the power auxiliary grid line 7, shown in FIGS. 1 and 2, are formed on the TFT protection film 19. The power auxiliary grid line 7 is disposed, for example, in the form of rectangular frames along the pixel boundaries as illustrated in FIG. 3B. The anode electrode AE serving as the "lower layer electrode" of the organic light-emitting diode OLED is disposed over an as large area as possible within the power auxiliary grid line 7. In the present embodiment, the power auxiliary grid line 7 and anode electrode AE are provided at the same layer level and formed by the same material (anode metal layer: AM). The organic EL display device according to the present embodiment is a top emission display device. Therefore, a conductive material having a large work function and high reflectance can be selected for the anode metal layer (AM) as appropriate. Among the materials which may be used are chromium (Cr), iron (Fe), cobalt (Co), nickel (Ni), copper (Cu), tantalum (Ta), tungsten (W), platinum (Pt) and gold (Au).

The anode electrode AE is connected to the pad portion of the connection wiring 14B on the underlying layer by means of a contact 15 which is one of the second contact holes (2CH).

An EL protection film 21 (not shown), which covers the surfaces of the power auxiliary grid line 7 and anode electrode AE, is formed. An opening portion 21A is provided in the EL protection film 21. The same portion 21A is formed as large as possible on the anode electrode AE to the extent that the contact 15 is not exposed.

It should be noted that, although not specifically illustrated, an organic multilayer film is formed over the area including the opening portion 21A and that a cathode electrode is further provided. The cathode electrode is connected to the organic multilayer film and covers the entire surface. The cathode electrode is electrically connected to the power auxiliary grid line 7 via an opening portion 21B provided in the EL protection film 21 on top of the power auxiliary grid line 7. As illustrated in FIGS. 1 and 2, the power auxiliary grid line 7 is connected to the supply line of the ground voltage GND via the power auxiliary circumferential line 6. Therefore, the anode of the organic light-emitting diode OLED is grounded.

FIG. 5 is a plan view illustrating the connection portion between part of the pixel array 2 including two rows by two columns of the pixel circuits 3($i, j$) and the power auxiliary circumferential line 6.

In FIG. 5, same reference numerals denote same components shown and described in FIGS. 3A and 3B. A cathode electrode KE of the organic light-emitting diode OLED is formed over the entire area illustrated in FIG. 5. The cathode electrode KE is formed by a cathode metal layer (KM) with high optical transmittance. Therefore, FIG. 5 is a perspective view looking through the cathode electrode KE at the underlying layers thereof.

In the case of a top emission display device, the cathode metal layer KM is formed by a conductive material having a large work function and high transmittance such as ITO or IXO.

The power auxiliary circumferential line 6 includes upper and lower metal layers 6A and 6B laminated one over the other. The upper metal layer 6A is provided at the same layer level and made of the same material (anode metal layer; AM) as the power auxiliary grid line 7. The lower metal layer 6B is formed, for example, by (AL) on the underlying layer. The upper metal layer 6A and power auxiliary grid line 7 are joined together (or are formed integrally with each other) on the pattern.

The ends of the first and second scan lines SCAN1($i$) and SCAN2($i$) are located close to the power auxiliary circumferential line 6. The scan lines SCAN1($i$) and SCAN2($i$) are both made of (AL).

Of the two scan lines, the end of the first scan line SCAN1($i$) is connected to a bridge line 11E on the underlying layer by means of a contact 12E which is one of the first contacts (1CH). The bridge line 11E is a conductive layer including a gate metal layer (GM). The power auxiliary circumferential line 6 crosses over the bridge line 11E via an unshown insulating film.

Similarly, the end of the second scan line SCAN2($i$) is connected to a bridge line 11F on the underlying layer by means of a contact 12F which is one of the first contacts (1CH). The bridge line 11F is a conductive layer including a gate metal layer (GM). The power auxiliary circumferential line 6 crosses over the bridge line 11F via an unshown insulating film.

Figure 6:
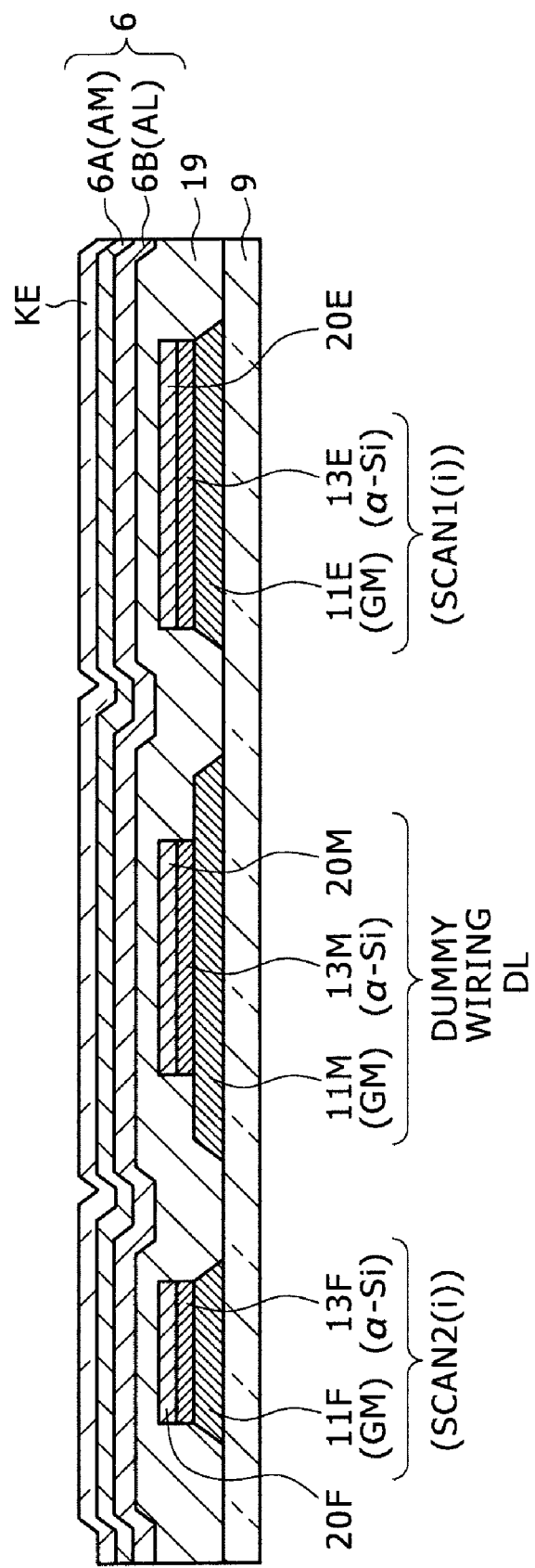
FIG. 6 is a sectional view of the connection portion taken along line A-A in FIG. 5 according to the first embodiment of the present invention.

FIG. 6 illustrates a sectional view taken along line A-A in FIG. 5.

In the illustrated example, a thin film semiconductor layer 13E, made of amorphous silicon ($\alpha$-Si), is laminated on the bridge line 11E of the first scan line SCAN1($i$). On the other hand, although omitted and not shown in FIG. 4B, an etching stopper film 20E of the thin film semiconductor layer 13E is laminated on the same layer 13E.

Similarly, a thin film semiconductor layer 13F and etching stopper film 20F are laminated on the bridge line 11F of the second scan line SCAN2($i$).

In the present embodiment, a dummy wiring DL is formed between the two scan lines having the above-mentioned sectional structure. The dummy wiring DL is spaced from and not electrically connected to the scan lines.

The dummy wiring DL includes first and second conductive layers 11M and 13M. The first conductive layer 11M is made of the gate metal (GM). The second conductive layer 13M is made of amorphous silicon ($\alpha$-Si) and laminated on the first conductive layer 11M. An etching stopper film 20M is further laminated on the second conductive layer 13M.

A silicon nitride-based insulating film should be used as the etching stopper film 20M and above-mentioned etching stopper films 20E and 20F if a silicon oxide-based insulating film is provided therearound because of a high etching selectivity ratio of silicon nitride to silicon oxide.

The TFT protection film 19 is formed on the substrate 9 to cover the bridge portions of the first and second scan lines SCAN1($i$) and SCAN2($i$) and the dummy wiring DL. On the TFT protection film 19, the power auxiliary circumferential line 6, which includes the lower and upper metal layers 6B and 6A laminated one over the other, is formed. Further, the cathode electrode KE is formed on the power auxiliary circumferential line 6.

Although a detailed description will be given later, the present embodiment effectively prevents disconnection of the power auxiliary circumferential line 6 due to a height difference and air holes, by the above arrangement of the dummy wiring DL.

Second Embodiment

The second embodiment differs from the first embodiment in the configuration around the dummy wiring DL. Therefore, FIGS. 1 to 5 and description thereof for the first embodiment also apply to the second embodiment.

Figure 7:
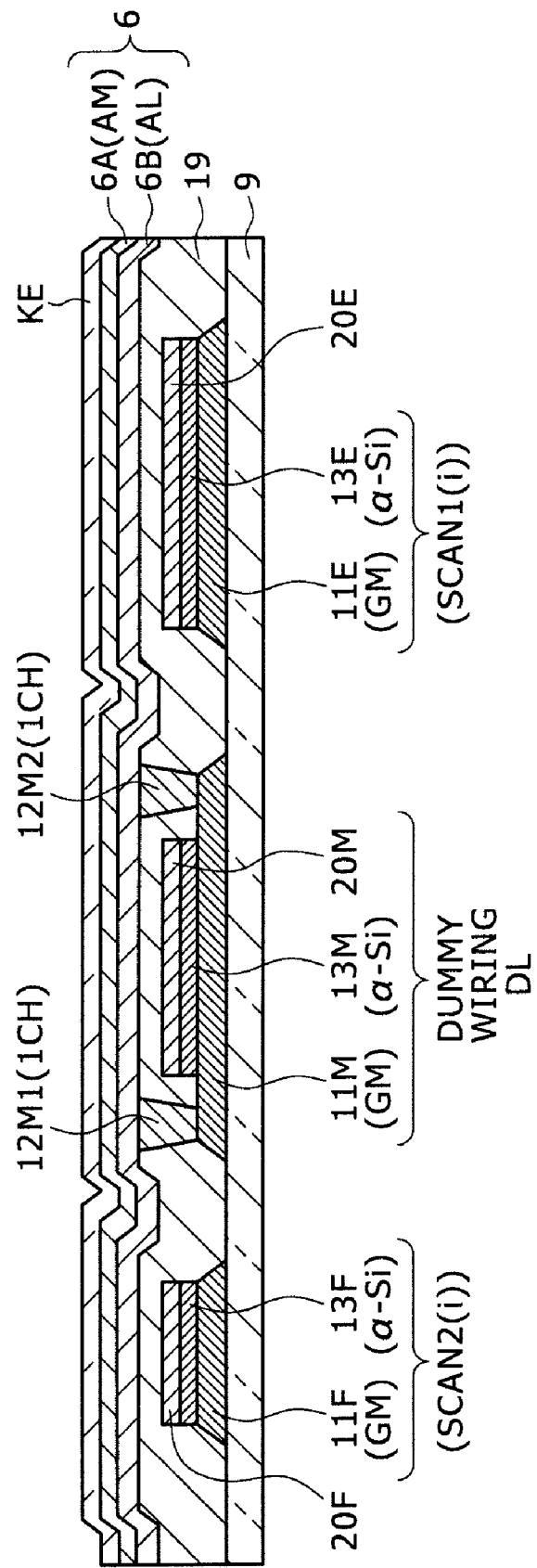
FIG. 7 is a sectional view of the connection portion taken along line A-A in FIG. 5 according to the second embodiment of the present invention.

FIG. 7 illustrates a sectional view taken along line A-A in FIG. 5 according to the second embodiment of the present invention.

FIG. 7 differs from FIG. 6 in that contacts 12M1 and 12M2, each including a first contact hole (1CH), are provided at each end of the dummy wiring DL, and that the two ends of the dummy wiring DL are connected to the rear surface of the power auxiliary circumferential line 6 by means of the contacts 12M1 and 12M2. The second embodiment is the same as the first embodiment in other configuration.

It should be noted that the EL protection film 21 is omitted in FIGS. 6 and 7.

MODIFICATION EXAMPLE

FIGS. 5 to 7 illustrate the intersections between the power auxiliary circumferential line 6 and first and second scan lines SCAN1(*i*) and SCAN2(*i*), with the dummy wiring DL disposed between the intersections and along the same line 6.

The similar dummy wiring DL may be disposed on the underlying layer between the intersections between the power auxiliary circumferential line 6 and signal lines, i.e., signal lines SIG(j), and along the same line 6. Further, the dummy wiring DL may be disposed not only between the intersections between the power auxiliary circumferential line 6 and scan lines but also between the intersections between the same line 6 and signal lines. In this case, either of the sectional structures shown in FIGS. 6 and 7 may be used.

In the second embodiment, it suffices to form at least one contact at each end of the dummy wiring DL or a total of two contacts for connection between the dummy wiring DL and power auxiliary circumferential line 6. Therefore, two or more contacts may be provided at each end of the dummy wiring DL. Alternatively, as many contacts as possible may be provided, for example, equidistantly all along the length of the dummy wiring DL.

In addition to the above, the layer structures of the scan and signal lines and those of the power auxiliary circumferential line and power auxiliary grid line are not limited to the illustrated example described above.

On the other hand, although a top emission organic EL display has been taken as an example in the first and second embodiments, a bottom emission organic EL display may also be used.

Thus, the first and second embodiments provide the following advantages.

That is, the dummy wiring DL alleviates the height differences on the surface of the power auxiliary circumferential line caused by the scan and signal lines, thus preventing disconnection due to height differences and air holes formed in the protection film on the power auxiliary circumferential line.

Figure 8:
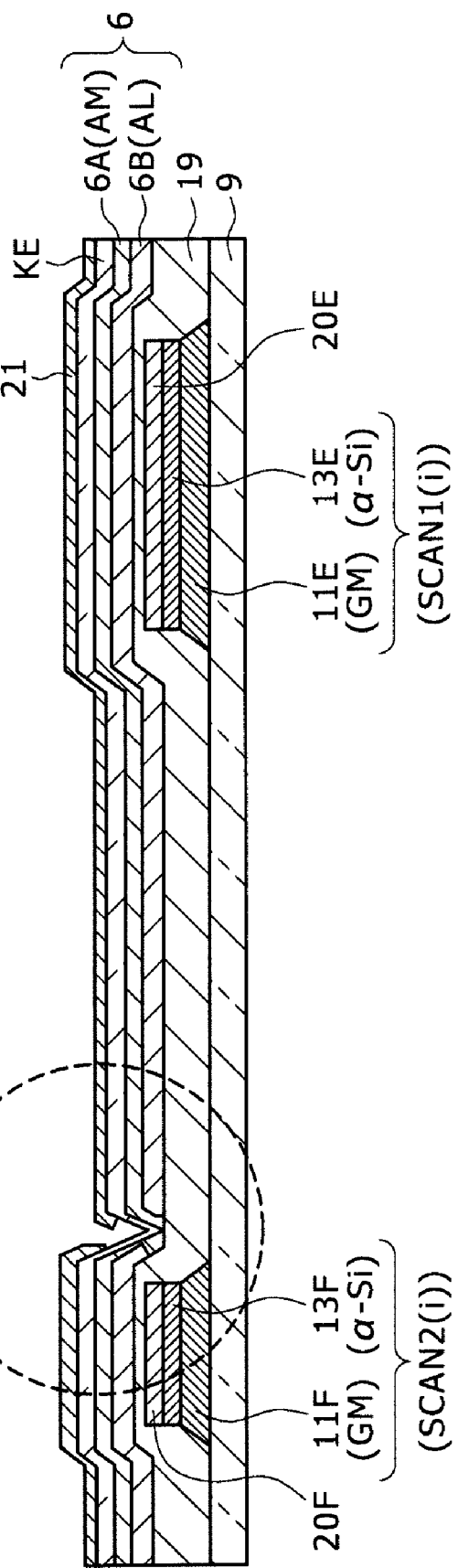
FIG. 8 is a sectional view of a comparative example with no dummy wirings in which an air hole has developed.

FIG. 8 illustrates a sectional view of the intersections with no dummy wirings in which an air hole has developed.

In this figure, the power auxiliary circumferential line 6 barely remains unbroken. However, the EL protection film 21 is broken at the height difference of the second scan line SCAN2(*i*). As a result, an air hole has developed. Once an air hole develops, the EL protection film 21 does not serve the protective purpose at that location. Therefore, moisture or other contaminants contaminate the power auxiliary circumferential line 6. In particular, if moisture finds its way into the pixel array 2 through the interface of the power auxiliary circumferential line 6, the organic light-emitting diode OLED will change its display characteristics, possibly degrading the image quality on part of the screen.

By having the dummy wiring DL, the first and second embodiments of the present invention prevent partial inconstancy in the potential of the cathode electrode KE resulting from the disconnection of the power auxiliary circumferential line 6, thus providing an advantage, namely, prevention of uneven display.

Further, the first and second embodiments prevent air holes, thus preventing image quality degradation and ensuring improved yield. As a result, these embodiments provide an advantage, namely, higher profitability and reliability of display products.

In addition to the above advantages, the electrical connection of the dummy wiring DL and power auxiliary circumferential line 6, as done in the second embodiment, permits the dummy wiring DL to function as a backing wiring of the power auxiliary circumferential line 6. As a result, the dummy wiring DL serves to further stabilize the potential of the power auxiliary circumferential line 6 to a smaller degree of variation. Further, if the power auxiliary circumferential line 6 between the contacts increases in resistance for some reason or if it disconnects, the dummy wiring DL acts as the same line 6. In this case, therefore, the dummy wiring serves the function of a partial redundant wiring of the power auxiliary circumferential line 6.

It should be understood by those skilled in the art that various modifications, combinations, sub-combinations and alterations may occur depending on design requirements and other factors insofar as they are within the scope of the appended claims or the equivalents thereof.

What is claimed is:

1. An organic electric field light-emitting display device comprising:

a plurality of pixel circuits, each disposed at one of the intersections between a plurality of signal lines and a plurality of scan lines, each of the pixel circuits including an organic electric field light-emitting element, each of the pixel circuits provided for each pixel;

a power auxiliary circumferential line electrically connected to one of two electrodes adapted to apply an electric field to the organic electric field light-emitting element, the power auxiliary circumferential line being disposed in a ring-like arrangement around the pixel arrangement region; and a plurality of dummy wirings connected to the power auxiliary circumferential line between intersections of the plurality of signal lines or the plurality of scan lines and the power auxiliary circumferential line, the plurality of dummy wirings being insulated from an adjacent signal or scan line.

2. The organic electric field light-emitting display device of claim 1, wherein each of the plurality of dummy wirings is electrically connected to the power auxiliary circumferential line at least at two locations in the direction in which the power auxiliary circumferential line is disposed so as to serve as a backing wiring of the power auxiliary circumferential line.

3. The organic electric field light-emitting display device of claim 1, wherein each of the plurality of pixel circuits includes a plurality of thin film transistors formed on a thin film semiconductor layer and gate electrode layer which are the underlying layers of the organic EL element, and the plurality of signal or scan lines at the intersections and the plurality of dummy wirings include at least two conductive layers laminated during the formation of each of the thin film semiconductor layer and gate electrode layer.

4. The organic electric field light-emitting display device of claim 1, wherein the organic electric field light-emitting element is formed by laminating a lower layer electrode, organic multilayer film and upper layer electrode one on top of the other, a power auxiliary grid line is formed by a wiring layer at the same layer level as the lower layer electrode around each of the pixel circuits and is electrically connected to the upper layer electrode, the power auxiliary grid line and power auxiliary circumferential line are formed by the wiring layer at the same layer level, the plurality of signal or scan lines have each of their ends connected to a bridge line on the underlying layer for extension, the bridge line being at the same layer level as the dummy wirings, and the power auxiliary circumferential line crosses over each of the plurality of bridge lines via an insulating film.

5. The organic electric field light-emitting display device of claim 4, wherein each of the plurality of pixel circuits includes a plurality of thin film transistors (TFTs) formed on a thin film semiconductor layer and gate electrode layer which are the underlying layers of the organic EL element, and the plurality of bridge lines and the plurality of dummy wirings include at least two conductive layers laminated during the formation of the thin film semiconductor layer and gate electrode layer.

* * * * *